(12) United States Patent
Shi et al.

(10) Patent No.: US 12,134,627 B2
(45) Date of Patent: Nov. 5, 2024

(54) BORON HYDROXYL-CONTAINING ORGANIC COMPOUND, METHOD FOR PREPARING SAME AND USE THEREOF

(71) Applicant: JIANGSU UNIVERSITY OF SCIENCE AND TECHNOLOGY, Jiangsu (CN)

(72) Inventors: Chao Shi, Jiangsu (CN); Qiuxia Li, Jiangsu (CN); Gang Li, Jiangsu (CN)

(73) Assignee: JIANGSU UNIVERSITY OF SCIENCE AND TECHNOLOGY, Jiangsu (CN)

( * ) Notice: Subject to any disclaimer, the term of this patent is extended or adjusted under 35 U.S.C. 154(b) by 631 days.

(21) Appl. No.: 17/607,409

(22) PCT Filed: Dec. 14, 2020

(86) PCT No.: PCT/CN2020/136074
§ 371 (c)(1),
(2) Date: Oct. 29, 2021

(87) PCT Pub. No.: WO2022/104965
PCT Pub. Date: May 27, 2022

(65) Prior Publication Data
US 2023/0099951 A1 Mar. 30, 2023

(30) Foreign Application Priority Data
Nov. 20, 2020 (CN) .......................... 202011316931.4

(51) Int. Cl.
| | | |
|---|---|---|
| C07F 5/02 | (2006.01) | |
| C09K 11/06 | (2006.01) | |
| H10K 85/30 | (2023.01) | |
| H10K 85/60 | (2023.01) | |
| H10K 50/11 | (2023.01) | |

(52) U.S. Cl.
CPC .............. *C07F 5/025* (2013.01); *C09K 11/06* (2013.01); *H10K 85/322* (2023.02); *H10K 85/631* (2023.02); *H10K 85/657* (2023.02); *H10K 85/6572* (2023.02); *C09K 2211/1007* (2013.01); *C09K 2211/1014* (2013.01); *C09K 2211/1029* (2013.01); *C09K 2211/1033* (2013.01); *C09K 2211/1044* (2013.01); *H10K 50/11* (2023.02)

(58) Field of Classification Search
CPC ....................................................... C07F 5/025
USPC ............................................................ 544/69
See application file for complete search history.

(56) References Cited

FOREIGN PATENT DOCUMENTS

| | | |
|---|---|---|
| CN | 108948056 | 12/2018 |
| CN | 109134520 | 1/2019 |
| FR | 3021050 | 11/2015 |

OTHER PUBLICATIONS

"International Search Report (Form PCT/ISA/210)" of PCT/CN2020/136074, mailed on Jul. 26, 2021, pp. 1-5.
"Written Opinion of the International Searching Authority (Form PCT/ISA/237)" of PCT/CN2020/136074, mailed on Jul. 26, 2021, pp. 1-5.

*Primary Examiner* — Taofiq A Solola
(74) *Attorney, Agent, or Firm* — JCIP GLOBAL INC.

(57) ABSTRACT

The present invention relates to a boron hydroxyl-containing organic compound having a structural formula shown in formula I. The present invention also relates to a method for preparing the boron hydroxyl-containing organic compound and use thereof in an organic electronic device, particularly an organic light-emitting diode. The present invention further relates to an organic electronic device, particularly an organic light-emitting diode, including the boron hydroxyl-containing organic compound according to the present invention and use thereof in display and lighting technology. By optimizing the structure of the device and altering the concentration of the boron hydroxyl-containing organic compound in the substrate, the optimal device performance can be achieved so as to produce an OLED device with high efficiency, high brightness and high stability, which provides a better material option for use in full-color display and lighting.

8 Claims, 2 Drawing Sheets

BORON HYDROXYL-CONTAINING ORGANIC COMPOUND, METHOD FOR PREPARING SAME AND USE THEREOF

This is a 371 application of the International PCT application serial no. PCT/CN2020/136074, filed on Dec. 14, 2020, which claims the priority benefits of China Application No. 202011316931.4, filed on Nov. 20, 2020. The entirety of each of the above-mentioned patent applications is hereby incorporated by reference herein and made a part of this specification.

BACKGROUND

Technical Field

The present invention relates to the technical field of novel materials, and particularly to a boron hydroxyl-containing organic compound, a method for preparing the same and use thereof.

Description of Related Art

Organic light-emitting diodes (OLEDs) have great potential for use in optoelectronic devices such as flat panel displays and lighting due to the diversity in synthesis, relatively low manufacturing costs and excellent optical and electrical properties of organic semiconductor materials.

In order to improve the luminous efficiency of pure organic light-emitting materials in organic light-emitting diodes, in 2012, professor Adachi of Kyushu university in Japan designed and synthesized a series of organic compound light-emitting materials characterized by the introduction of a series of electron donor units and electron acceptor units, which reduces the energy gap between the singlet energy level ($S_1$) and the triplet energy level ($T_1$) to a certain extent. As such, triplet excitons ($T_1$) can acquire thermal energy from the environment and thus the radioluminescence, also known as thermally activated delayed fluorescence, of singlet excitons ($S_1$) is realized through a reverse intersystem crossing process. Such luminescent process can greatly improve the luminous efficiency of pure organic materials. This has aroused great interest in pure organic thermally activated delayed fluorescence materials. To date, the internal quantum efficiency of pure organic thermally activated delayed fluorescent materials approximates 100%.

However, the luminescence properties and types of such materials still need further improvement. Particularly, the types of electron acceptor units selected at present are limited, and for example, boron hydroxyl-containing light-emitting materials of organic electron acceptor units have not been developed yet. In order to further improve the properties of such pure organic luminescent materials and expand the selection of such materials, pure organic compound materials including novel electron acceptor units are urgently needed.

SUMMARY

Purpose: In view of the above defects in the prior art, the present invention is intended to provide a novel boron hydroxyl-containing organic compound. Particularly, a series of novel thermally activated delayed fluorescence materials are prepared, with boron hydroxyl-containing xanthene or thioxanthene used as an electron acceptor unit and triarylamine, carbazole and a derivative thereof with a strong electron donating ability used as an electron donor unit. Due to the novel and excellent electron acceptor unit, good rigidity and chemical and thermal stabilities of such compounds, the stability and luminous efficiency of the compounds and thus the performance of corresponding devices, can be effectively improved.

Technical Scheme: The present invention provides a boron hydroxyl-containing organic compound of formula (I):

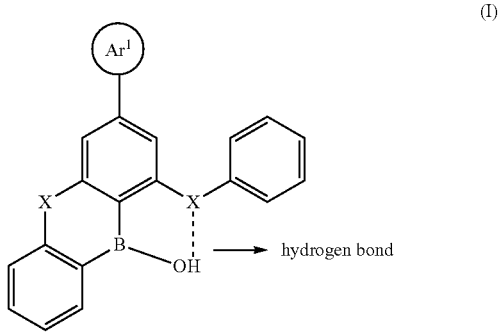

(I)

wherein $Ar^1$ in formula I is an aromatic cyclic hydrocarbon of an aromatic amine, carbazole or a derivative thereof with a strong electron donating ability, X in formula I is an oxygen or sulfur atom, and the dotted line ┊ represents a hydrogen bond formed between X (oxygen or sulfur atom) and the hydrogen atom in the hydroxyl (OH).

Specifically, the boron hydroxyl-containing organic compound is preferably selected from the following general formulas:

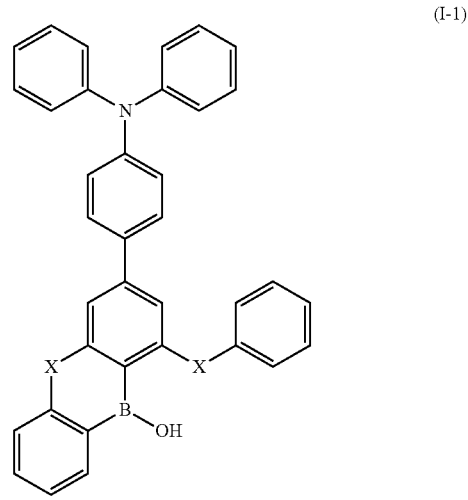

(I-1)

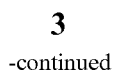
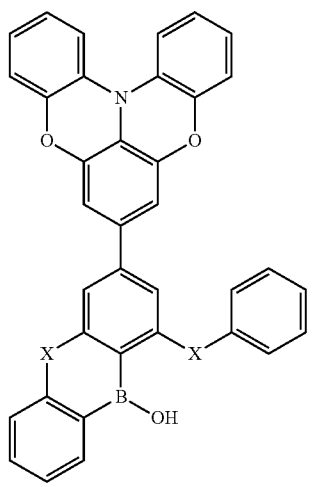
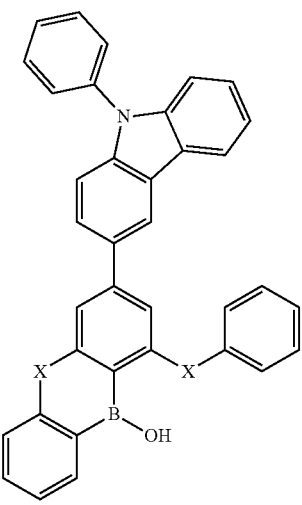
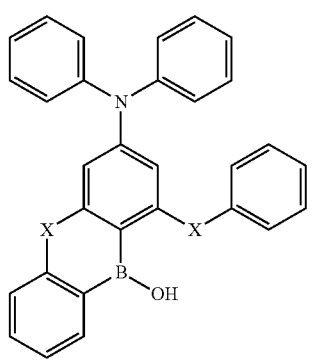
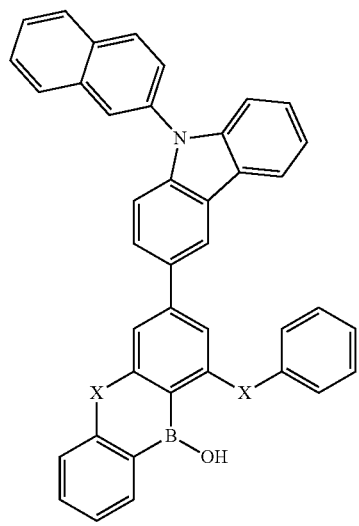
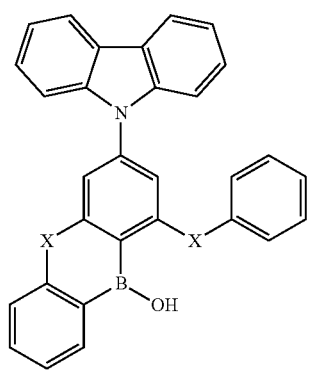
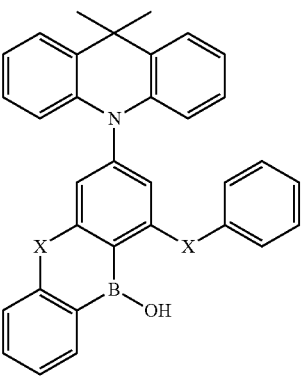

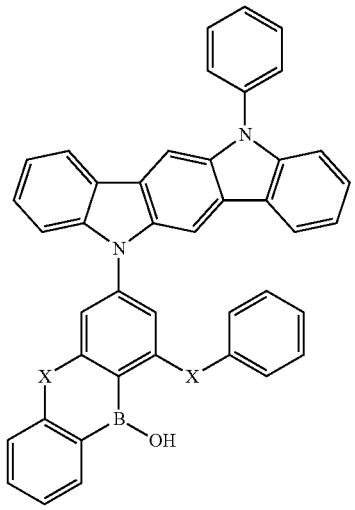

(I-8)

wherein X is an oxygen or sulfur atom.

The present invention also provides a method for preparing a boron hydroxyl-containing organic compound, including:

1) first reacting 2-bromo-1,3-difluoro-5-iodobenzene (1-a) as a starting material with phenol or thiophenol at a high temperature in an alkaline environment to give a corresponding diphenyl oxide derivative or diphenyl sulfide derivative;

2) then conducting a Suzuki coupling reaction of the diphenyl oxide derivative (1-b) or diphenyl sulfide derivative (2-b) prepared in step 1) with an aromatic amine, carbazole or a derivative thereof containing boric acid or a boric ester to synthesize a corresponding coupling intermediate (1-c, 2-c, 3-c, 4-c, 9-c, 10-c, 11-c and 12-c); or conducting a Buchwald-Hartwig coupling reaction of the diphenyl oxide derivative (1-b) or diphenyl sulfide derivative (2-b) with diarylamine, carbazole and a derivative thereof to synthesize a corresponding coupling intermediate (5-c, 6-c, 7-c, 8-c, 13-c, 14-c, 15-c and 16-c); and 3) finally removing the bromine atom from the coupling intermediate (1-c to 16-c) prepared in step 2) using n-BuLi in the absence of water and oxygen at a low temperature, adding boron tribromide and stirring in an alkaline environment of N,N-diisopropylethylamine with controlled reaction temperature and time to finally give the boron hydroxyl-containing organic compound disclosed herein. In the present invention, the starting materials, reaction conditions and the like are controlled such that the boron hydroxyl-containing organic compound is half annulated, as specifically shown in B-1 to B-16, with a hydrogen bond contained in the structure. Therefore, these compounds are half annulated and have the main structure shown below:

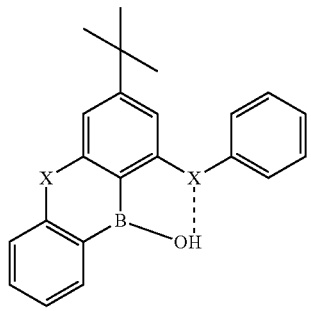

while compounds synthesized in the prior art share a fully annulated structure similar to

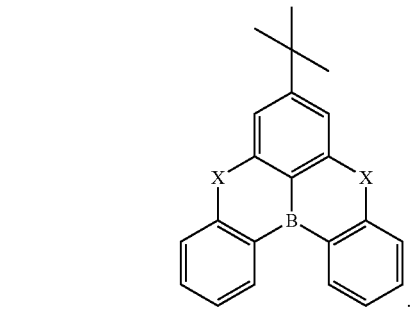

The present invention also provides use of the boron hydroxyl-containing organic compound according to the present invention in an organic electronic device, wherein:

the organic electronic device is an organic light-emitting diode (OLED), an organic photovoltaic cell (OPV), an organic light-emitting cell (OLEEC), an organic field-effect transistor (OFET), an organic light-emitting field-effect transistor, an organic laser, an organic spintronic device, an organic sensor or an organic plasmon-emitting diode.

The present invention also provides an organic electronic device including the boron hydroxyl-containing organic compound, wherein:

the boron hydroxyl-containing organic compound has a mass concentration of 5-15 wt %.

Specifically, suitable non-limiting examples of the boron hydroxyl-containing organic compounds according to the present invention are given below:
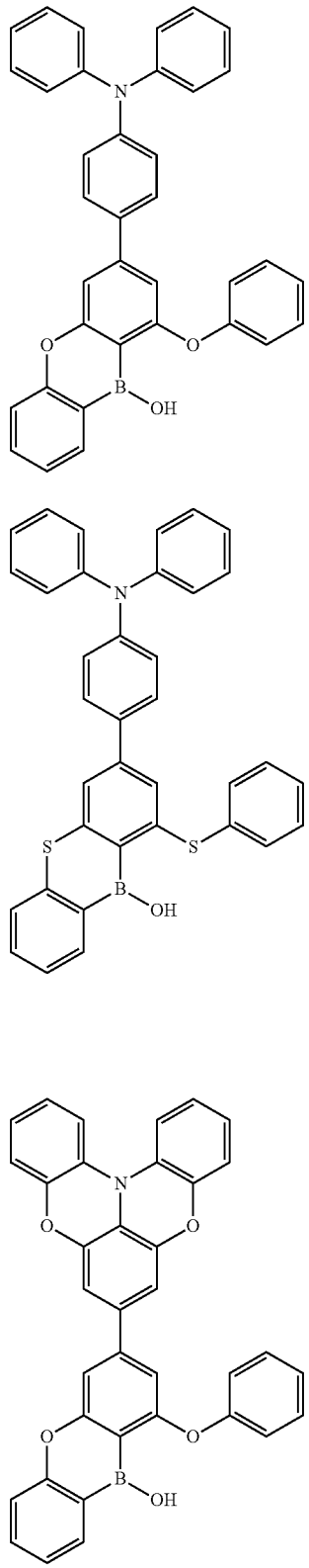
B-1
B-2
B-3
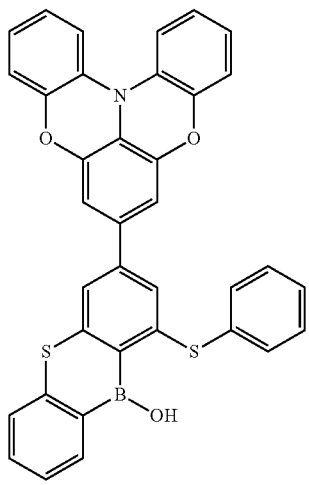
B-4
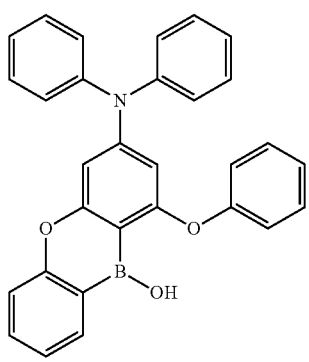
B-5
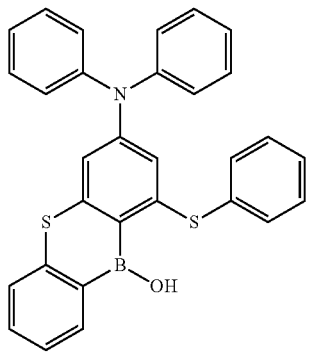
B-6
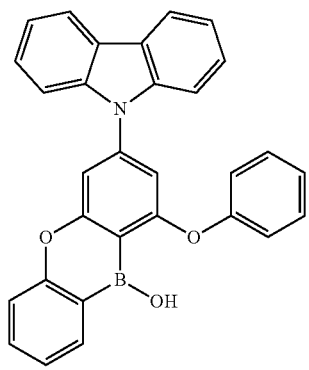
B-7

B-8
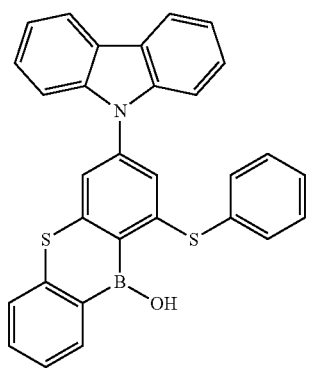
B-9
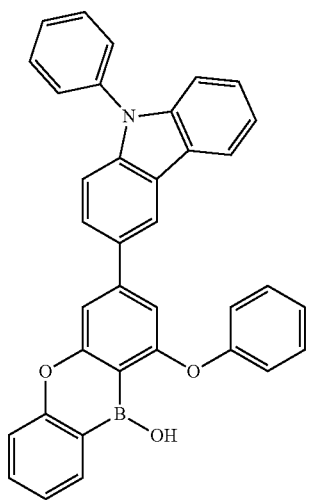
B-10
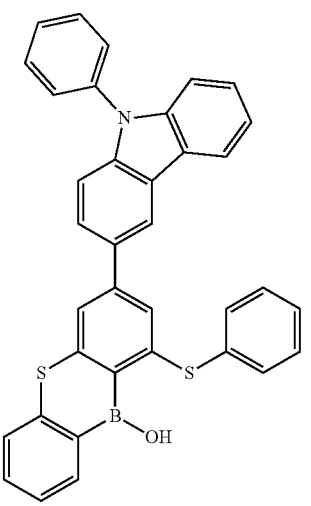
B-11
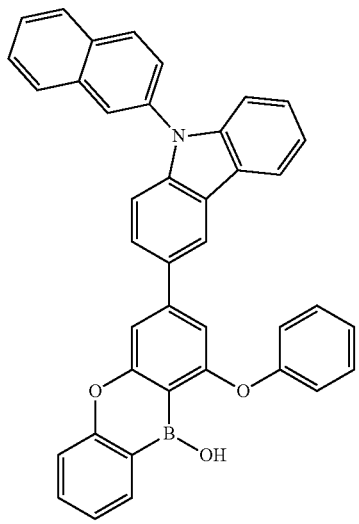
B-12
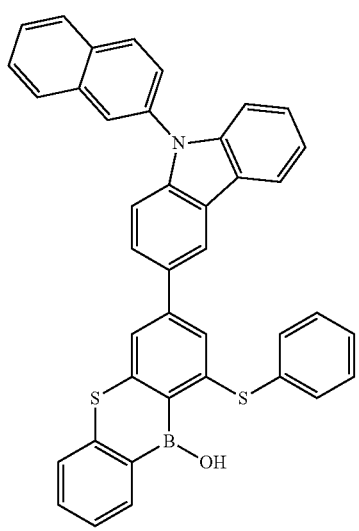
B-13
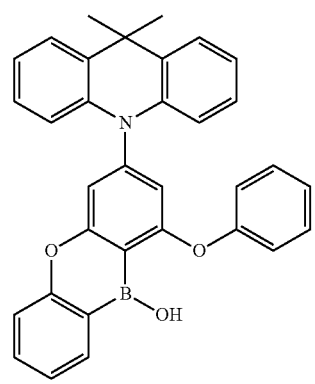

-continued

B-14
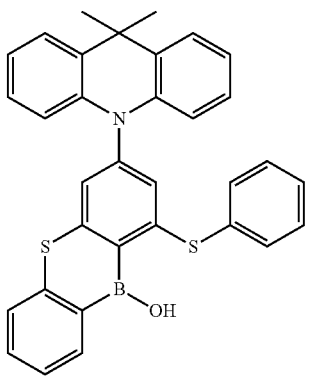

B-15
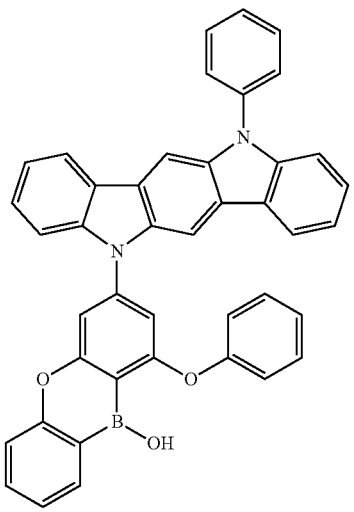

B-16
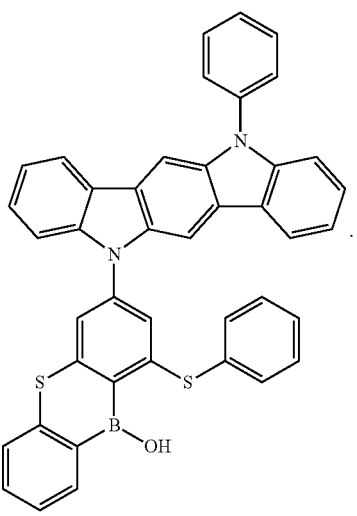

Beneficial Effects: Compared to the prior art, the present invention has the following advantages: due to the novel and excellent electron acceptor unit, good rigidity and chemical and thermal stabilities of such compounds prepared herein, the stability and luminous efficiency of the compounds and thus the performance of corresponding devices, can be effectively improved. The present invention further relates to an organic electronic device, particularly an organic light-emitting diode, including the boron hydroxyl-containing organic compound according to the present invention and use thereof in display and lighting technology. By optimizing the structure of the device and altering the concentration of the boron hydroxyl-containing organic compound in the substrate, the optimal device performance can be achieved so as to produce an OLED device with high efficiency, high brightness and high stability, which provides a better material option for use in full-color display and lighting.

DESCRIPTION OF THE EMBODIMENTS

EXAMPLE 1

Figure 1:
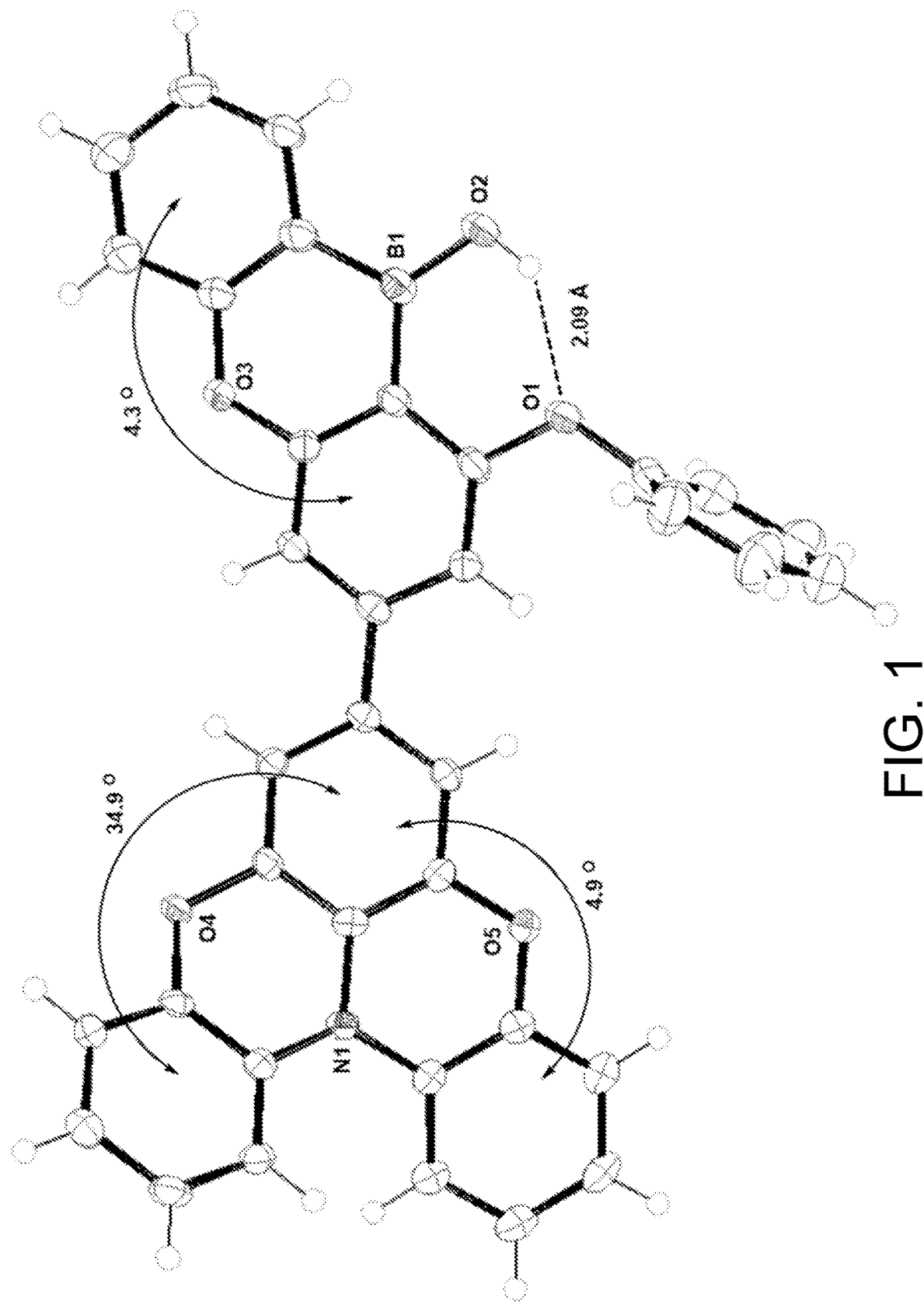
FIG. 1 shows an X-ray monocrystalline structure of boron hydroxyl-containing organic compound B-3.

Synthesis of Boron Hydroxyl-Containing Organic Compound B-1

The synthetic route of boron hydroxyl-containing organic compound B-1 is as follows:

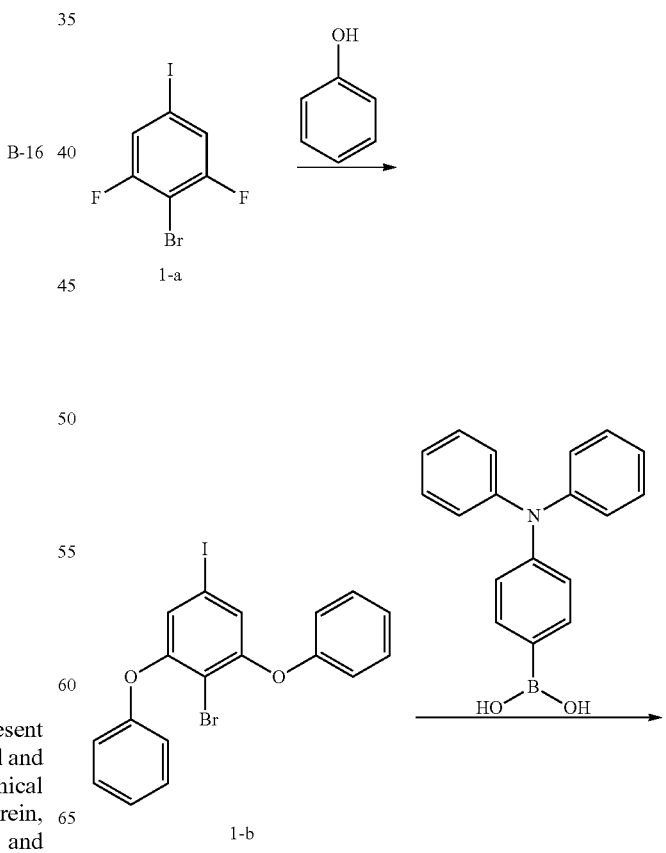

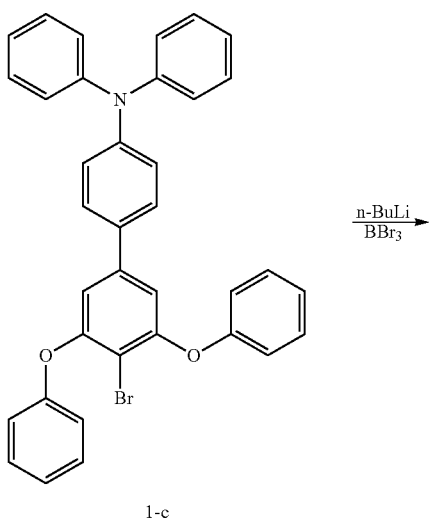

1-c

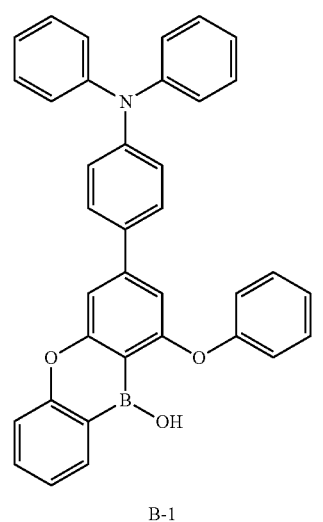

B-1

1. Synthesis of Intermediate 1-b:

To a dry two-necked flask were added 1-a (0.63 g, 2 mmol), potassium carbonate (1.10 g, 8 mmol) and phenol (0.75 g, 8 mmol), followed by three vacuum/nitrogen purge cycles. 10 mL of N-methylpyrrolidone was added. The resultant mixture was stirred at 150° C. for 24 h, cooled to room temperature, added with water to precipitate and filtered under reduced pressure. The residue was washed with n-hexane and dried to give a white solid (0.79 g, 85% yield).

2. Synthesis of Intermediate 1-c:

To a dry two-necked flask were added 1-b (3.72 g, 8 mmol), 4-(diphenylamino)phenylboronic acid (2.54 g, 8.8 mmol) and Pd[(PPh)$_3$]$_4$ (0.28 g, 0.24 mmol), followed by three vacuum/nitrogen purge cycles. 32 mL of 1,4-dioxane and 16 mL of an aqueous solution of K$_2$CO$_3$ (2 M) were added. The resultant mixture was stirred at 105° C. for 12 h, cooled to room temperature, extracted with dichloromethane, concentrated to remove dioxane, added to a large amount of dichloromethane and filtered through silica gel. The filtrate was concentrated and then recrystallized using a mixed solvent of dichloromethane and petroleum ether to give a white solid (3.73 g, 80% yield).

3. Synthesis of Boron Hydroxyl-Containing Organic Compound B-1:

To a dry Schlenk flask was added 1-c (0.29 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr$_3$ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.04 g, 15% yield).

EXAMPLE 2

Synthesis of Boron Hydroxyl-Containing Organic Compound B-2

The synthetic route of a boron hydroxyl-containing organic compound B-2 is as follows:

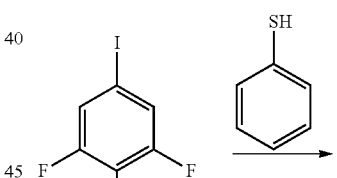

1-a

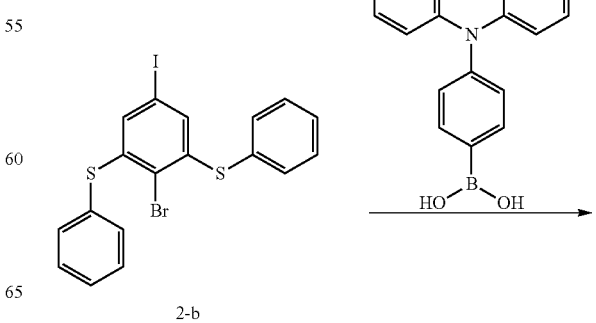

2-b

-continued

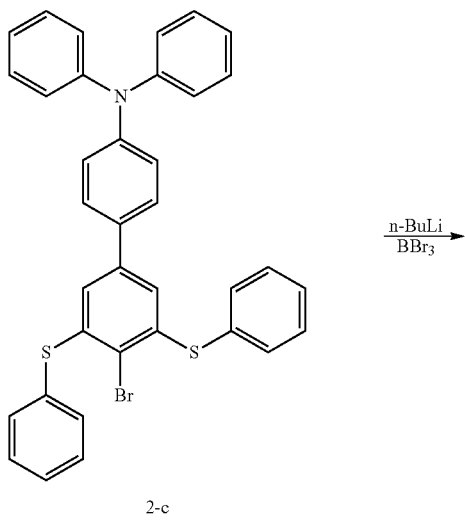

2-c

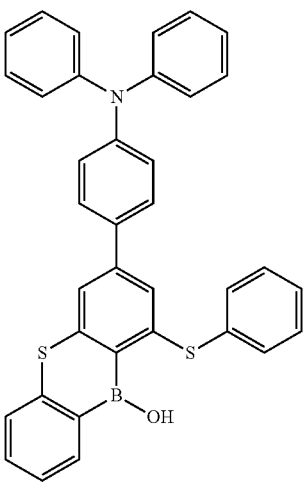

B-2

1. Synthesis of Intermediate 2-b:

To a dry two-necked flask were added 1-a (0.63 g, 2 mmol), potassium carbonate (1.10 g, 8 mmol) and benzenethiol (0.88 g, 8 mmol), followed by three vacuum/nitrogen purge cycles. 10 mL of N-methylpyrrolidone was added. The resultant mixture was stirred at 150° C. for 24 h, cooled to room temperature, added with water to precipitate and filtered under reduced pressure. The residue was washed with n-hexane and dried to give a white solid (0.74 g, 75% yield).

2. Synthesis of Intermediate 2-c:

To a dry two-necked flask were added 2-b (3.98 g, 8 mmol), 4-(diphenylamino)phenylboronic acid (2.54 g, 8.8 mmol) and Pd[(PPh)$_3$]$_4$ (0.28 g, 0.24 mmol), followed by three vacuum/nitrogen purge cycles. 32 mL of 1,4-dioxane and 16 mL of an aqueous solution of K$_2$CO$_3$ (2 M) were added. The resultant mixture was stirred at 105° C. for 12 h, cooled to room temperature, extracted with dichloromethane, concentrated to remove dioxane, added to a large amount of dichloromethane and filtered through silica gel. The filtrate was concentrated and then recrystallized using a mixed solvent of dichloromethane and petroleum ether to give a white solid (4.03 g, 82% yield).

3. Synthesis of Boron Hydroxyl-Containing Organic Compound B-2:

To a dry Schlenk flask was added 2-c (0.31 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr$_3$ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.03 g, 10% yield).

EXAMPLE 3

Synthesis of Boron Hydroxyl-Containing Organic Compound B-3

The synthetic route of a boron hydroxyl-containing organic compound B-3 is as follows:

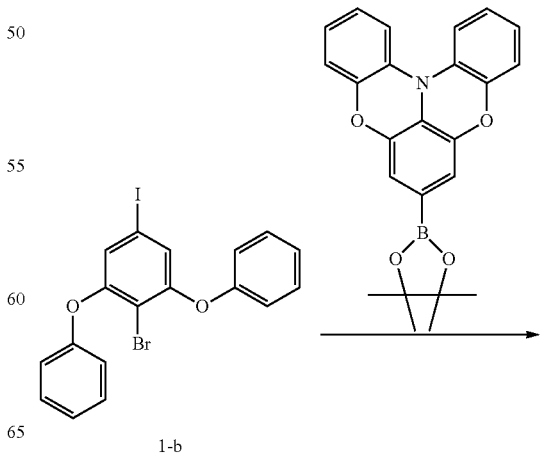

1-b

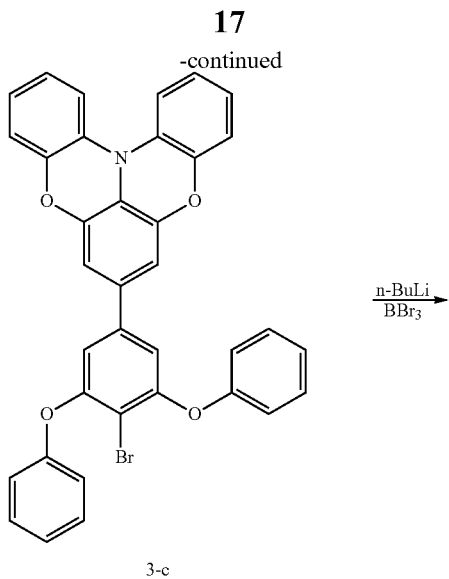

3-c

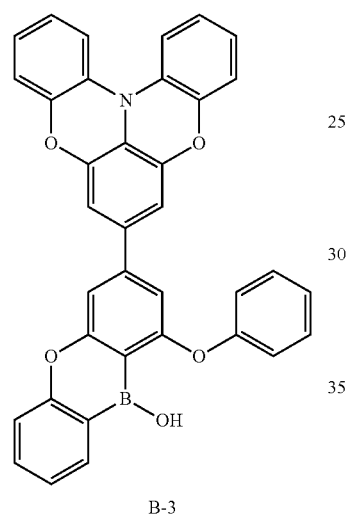

B-3

1. Synthesis of Intermediate 3-c:

To a dry two-necked flask were added 1-b (3.72 g, 8 mmol), 7-(4,4,5,5-tetramethyl-1,3,2-dioxaborolan-2-yl)benzo[5,6][1,4]oxazino[2,3,4-kl]phenoxazine (1-b in Dalton Trans. 2019, 48, 4596-4601) (3.51 g, 8.8 mmol) and Pd[(PPh)$_3$]$_4$ (0.28 g, 0.24 mmol), followed by three vacuum/nitrogen cycles. 32 mL of 1,4-dioxane and 16 mL of an aqueous solution of K$_2$CO$_3$ (2 M) were added. The resultant mixture was stirred at 105° C. for 12 h, cooled to room temperature, extracted with dichloromethane, concentrated to remove dioxane and purified by column chromatography on silica gel using a large amount of dichloromethane, and the filtrate was concentrated and then recrystallized from a mixed solvent of dichloromethane and petroleum ether to give a white solid (3.91 g, 80% yield).

2. Synthesis of Boron Hydroxyl-Containing Organic Compound B-3:

To a dry Schlenk flask was added 3-c (0.31 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr$_3$ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.03 g, 10% yield).

EXAMPLE 4

Synthesis of Boron Hydroxyl-Containing Organic Compound B-4

The synthetic route of a boron hydroxyl-containing organic compound B-4 is as follows:

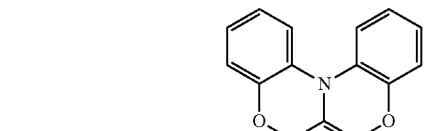

2-b

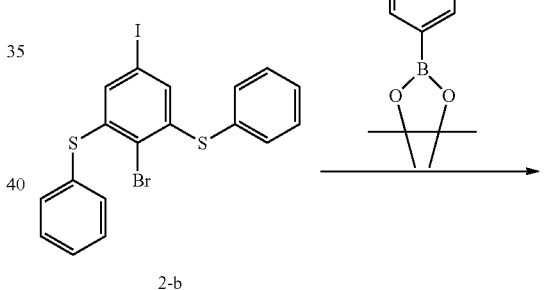

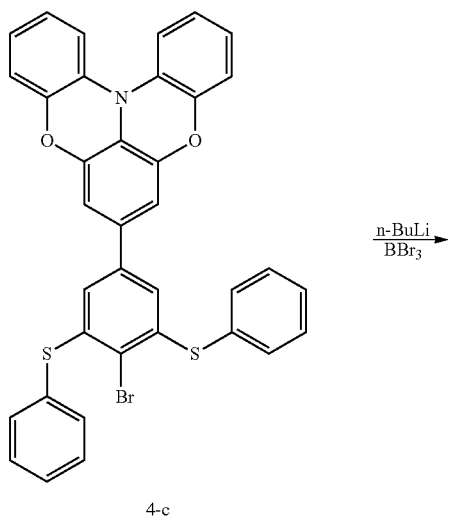

4-c

-continued

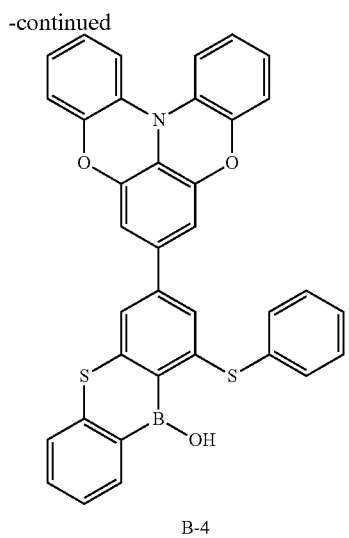

B-4

1. Synthesis of Intermediate 4-c:

To a dry two-necked flask were added 2-b (3.98 g, 8 mmol), 7-(4,4,5,5-tetramethyl-1,3,2-dioxaborolan-2-yl)benzo[5,6][1,4]oxazino[2,3,4-kl]phenoxazine (3.51 g, 8.8 mmol) and Pd[(PPh)$_3$]$_4$ (0.28 g, 0.24 mmol), followed by three vacuum/nitrogen cycles. 32 mL of 1,4-dioxane and 16 mL of an aqueous solution of K$_2$CO$_3$ (2 M) were added. The resultant mixture was stirred at 105° C. for 12 h, cooled to room temperature, extracted with dichloromethane, concentrated to remove dioxane and purified by column chromatography on silica gel using a large amount of dichloromethane, and the filtrate was concentrated and then recrystallized from a mixed solvent of dichloromethane and petroleum ether to give a white solid (3.86 g, 75% yield).

2. Synthesis of Boron Hydroxyl-Containing Organic Compound B-4:

To a dry Schlenk flask was added 4-c (0.32 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr$_3$ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.02 g, 8% yield).

EXAMPLE 5

Synthesis of Boron Hydroxyl-Containing Organic Compound B-5

The synthetic route of a boron hydroxyl-containing organic compound B-5 is as follows:

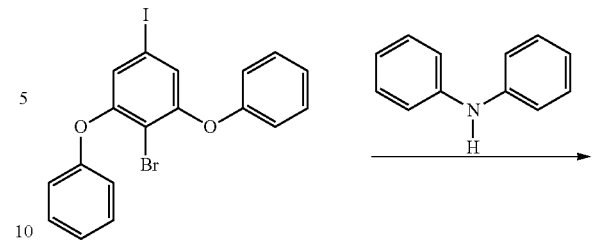

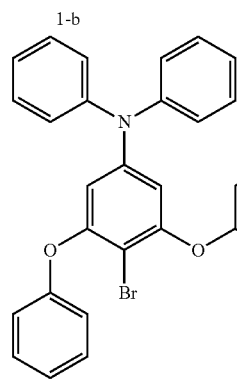

5-c

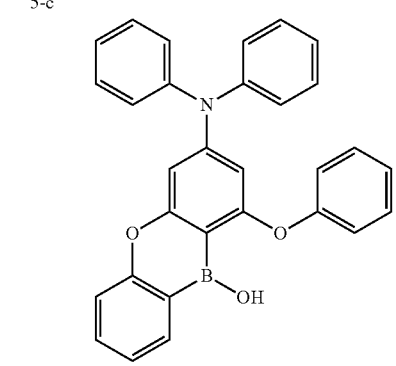

B-5

1. Synthesis of Intermediate 5-c:

To a dry two-necked flask were added 1-b (5.11 g, 11 mmol), diphenylamine (1.69 g, 10 mmol), Pd$_2$(dba)$_3$ (280 mg, 0.3 mmol), sodium tert-butoxide (2 g, 20 mmol) and tri-tert-butylphosphine (1.8 mL, 0.9 mmol), followed by addition of 200 mL of toluene. The resultant mixture was stirred at 100° C. for 12 h, concentrated to remove toluene, then added with water and extracted with dichloromethane. The filtrate was concentrated and then purified by column chromatography (dichloromethane:petroleum ether=1:2) to finally give a white solid (4.05 g, 80% yield).

2. Synthesis of Boron Hydroxyl-Containing Organic Compound B-5:

To a dry Schlenk flask was added 5-c (0.25 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr$_3$ (0.65 mmol, 0.061 mL), stirred at −40° C. for 30 min, transferred to an environment with room temperature and stirred for 1 h. The reaction mixture was cooled to 0° C.

in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.02 g, 10% yield).

EXAMPLE 6

Synthesis of Boron Hydroxyl-Containing Organic Compound B-6

The synthetic route of a boron hydroxyl-containing organic compound B-6 is as follows:

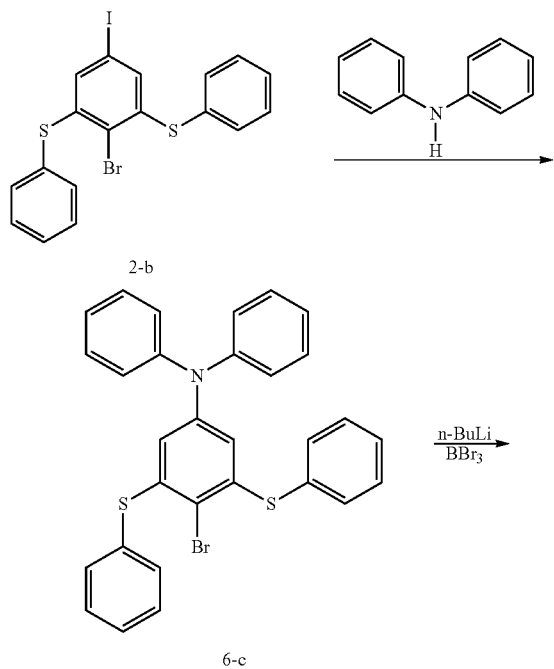

1. Synthesis of Intermediate 6-c:

To a dry two-necked flask were added 2-b (5.47 g, 11 mmol), diphenylamine (1.69 g, 10 mmol), $Pd_2(dba)_3$ (280 mg, 0.3 mmol), sodium tert-butoxide (2 g, 20 mmol) and tri-tert-butylphosphine (1.8 mL, 0.9 mmol), followed by addition of 200 mL of toluene. The resultant mixture was stirred at 100° C. for 12 h, concentrated to remove toluene, then added with water and extracted with dichloromethane. The filtrate was concentrated and then purified by column chromatography (dichloromethane:petroleum ether=1:2) to finally give a white solid (4.31 g, 80% yield).

2. Synthesis of Boron Hydroxyl-Containing Organic Compound B-6:

To a dry Schlenk flask was added 6-c (0.27 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with $BBr_3$ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.02 g, 10% yield).

EXAMPLE 7

Synthesis of Boron Hydroxyl-Containing Organic Compound B-7

The synthetic route of a boron hydroxyl-containing organic compound B-7 is as follows:

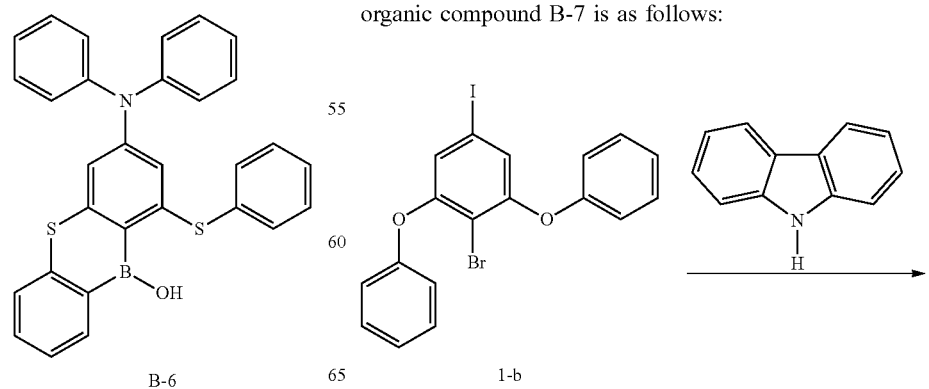

23

-continued

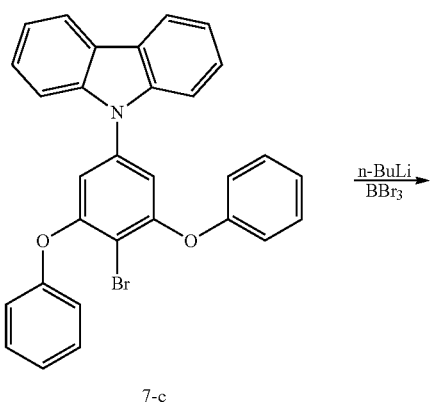

7-c

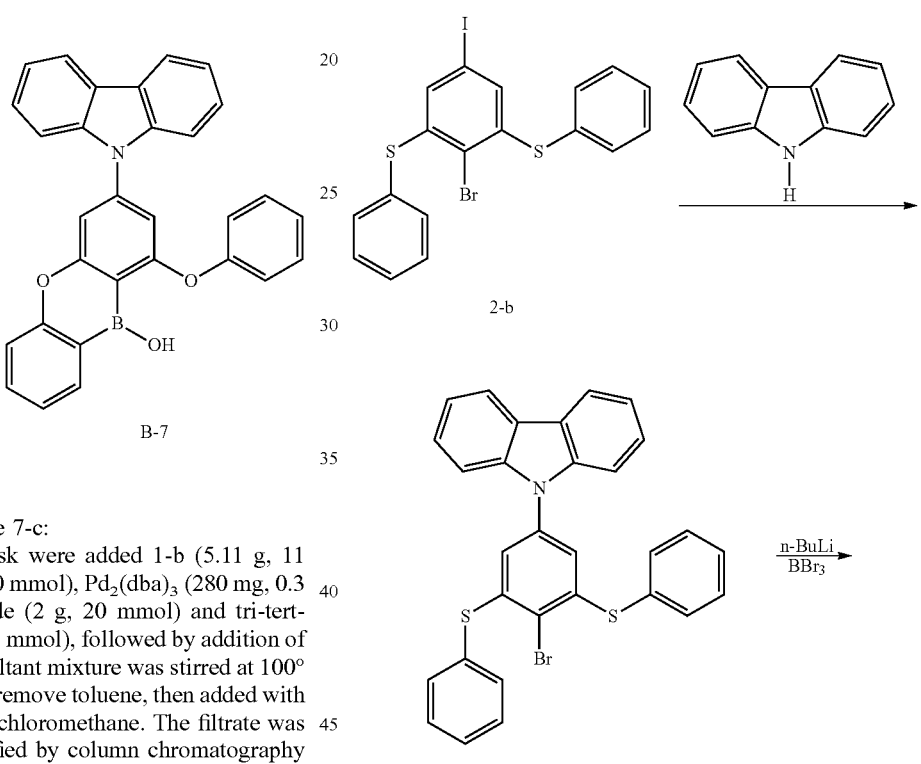

1. Synthesis of Intermediate 7-c:

To a dry two-necked flask were added 1-b (5.11 g, 11 mmol), carbazole (1.67 g, 10 mmol), Pd$_2$(dba)$_3$ (280 mg, 0.3 mmol), sodium tert-butoxide (2 g, 20 mmol) and tri-tert-butylphosphine (1.8 mL, 0.9 mmol), followed by addition of 200 mL of toluene. The resultant mixture was stirred at 100° C. for 12 h, concentrated to remove toluene, then added with water and extracted with dichloromethane. The filtrate was concentrated and then purified by column chromatography (dichloromethane:petroleum ether=1:2) to finally give a white solid (4.06 g, 80% yield).

2. Synthesis of Boron Hydroxyl-Containing Organic Compound B-7:

To a dry Schlenk flask was added 7-c (0.25 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr$_3$ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethyl-amine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.02 g, 10% yield).

EXAMPLE 8

Synthesis of Boron Hydroxyl-Containing Organic Compound B-8

The synthetic route of a boron hydroxyl-containing organic compound B-8 is as follows:

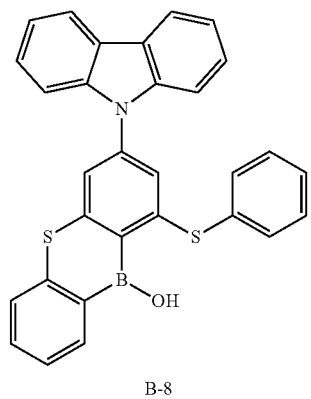

B-8

1. Synthesis of Intermediate 8-c:

To a dry two-necked flask were added 2-b (5.47 g, 11 mmol), carbazole (1.67 g, 10 mmol), Pd$_2$(dba)$_3$ (280 mg, 0.3 mmol), sodium tert-butoxide (2 g, 20 mmol) and tri-tert-butylphosphine (1.8 mL, 0.9 mmol), followed by addition of 200 mL of toluene. The resultant mixture was stirred at 100° C. for 12 h, concentrated to remove toluene, then added with water and extracted with dichloromethane. The filtrate was concentrated and then purified by column chromatography (dichloromethane:petroleum ether=1:2) to finally give a white solid (4.30 g, 80% yield).

2. Synthesis of Boron Hydroxyl-Containing Organic Compound B-8:

To a dry Schlenk flask was added 8-c (0.27 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr$_3$ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.02 g, 10% yield).

EXAMPLE 9

Synthesis of Boron Hydroxyl-Containing Organic Compound B-9

The synthetic route of a boron hydroxyl-containing organic compound B-9 is as follows:

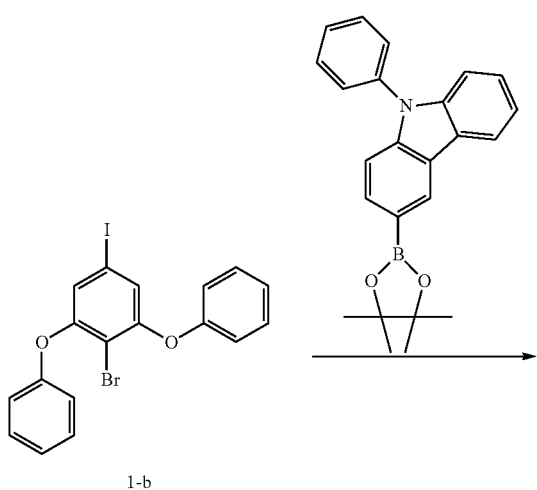

1. Synthesis of Intermediate 9-c:

To a dry two-necked flask were added 1-b (3.72 g, 8 mmol), 9-phenyl-3-(4,4,5,5-tetramethyl-1,3,2-dioxaborolan-2-yl)-9H-carbazole (cas: 1126522-69-7) (3.25 g, 8.8 mmol) and Pd[(PPh)$_3$]$_4$ (0.28 g, 0.24 mmol), followed by three vacuum/nitrogen purge cycles. 32 mL of 1,4-dioxane and 16 mL of an aqueous solution of K$_2$CO$_3$ (2 M) were added. The resultant mixture was stirred at 105° C. for 12 h, cooled to room temperature, extracted with dichloromethane, concentrated to remove dioxane, added to a large amount of dichloromethane and filtered through silica gel. The filtrate was concentrated and then recrystallized using a mixed solvent of dichloromethane and petroleum ether to give a white solid (3.95 g, 85% yield).

2. Synthesis of Boron Hydroxyl-Containing Organic Compound B-9:

To a dry Schlenk flask was added 9-c (0.29 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr₃ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.04 g, 15% yield).

EXAMPLE 10

Synthesis of Boron Hydroxyl-Containing Organic Compound B-10

The synthetic route of a boron hydroxyl-containing organic compound B-10 is as follows:

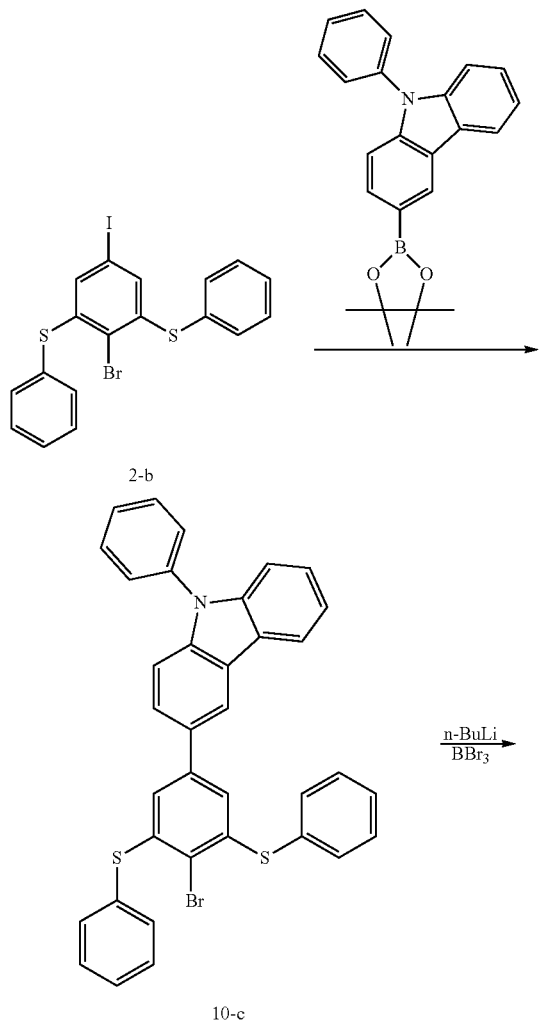

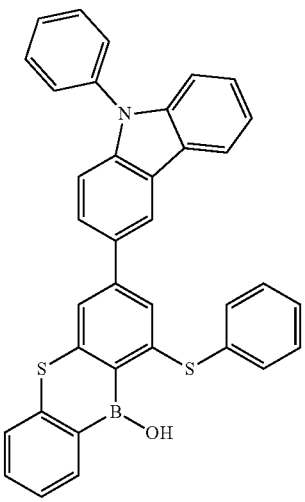

B-10

1. Synthesis of Intermediate 10-c:

To a dry two-necked flask were added 2-b (3.98 g, 8 mmol), 9-phenyl-3 -(4,4,5,5 -tetramethyl-1,3,2-dioxaborolan-2-yl)-9H-carbazole (cas: 1126522-69-7) (3.25 g, 8.8 mmol) and Pd[(PPh₃)₃]₄ (0.28 g, 0.24 mmol), followed by three vacuum/nitrogen purge cycles. 32 mL of 1,4-dioxane and 16 mL of an aqueous solution of K₂CO₃ (2 M) were added. The resultant mixture was stirred at 105° C. for 12 h, cooled to room temperature, extracted with dichloromethane, concentrated to remove dioxane, added to a large amount of dichloromethane and filtered through silica gel. The filtrate was concentrated and then recrystallized using a mixed solvent of dichloromethane and petroleum ether to give a white solid (3.92 g, 80% yield).

2. Synthesis of Boron Hydroxyl-Containing Organic Compound B-10:

To a dry Schlenk flask was added 10-c (0.31 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr₃ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.03 g, 12% yield).

EXAMPLE 11

Synthesis of Boron Hydroxyl-Containing Organic Compound B-11

The synthetic route of a boron hydroxyl-containing organic compound B-11 is as follows:

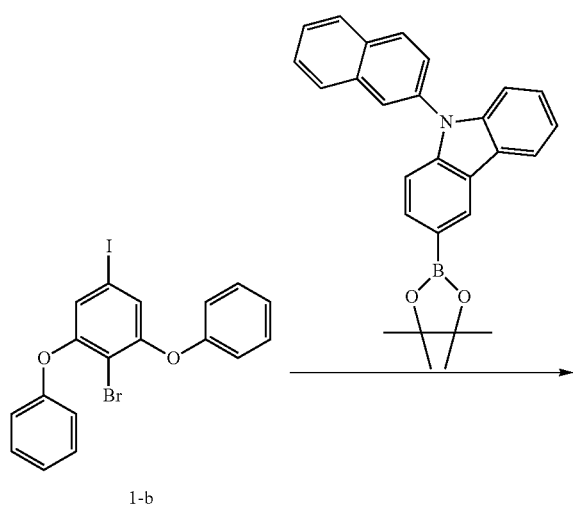

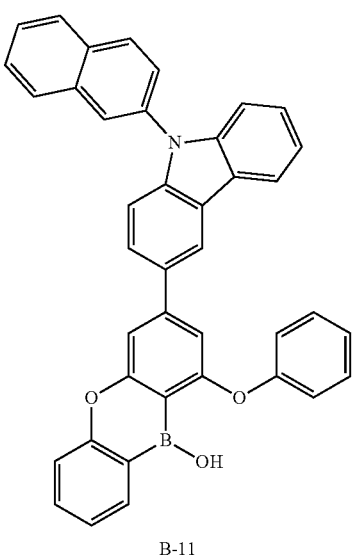

1. Synthesis of Intermediate 11-c:

To a dry two-necked flask were added 1-b (3.72 g, 8 mmol), 9-naphthyl-3-(4,4,5,5-tetramethyl-1,3,2-dioxaborolan-2-yl)-9H-carbazole (3.69 g, 8.8 mmol) and Pd[(PPh)$_3$]$_4$ (0.28 g, 0.24 mmol), followed by three vacuum/nitrogen purge cycles. 32 mL of 1,4-dioxane and 16 mL of an aqueous solution of K$_2$CO$_3$ (2 M) were added. The resultant mixture was stirred at 105° C. for 12 h, cooled to room temperature, extracted with dichloromethane, concentrated to remove dioxane, added to a large amount of dichloromethane and filtered through silica gel. The filtrate was concentrated and then recrystallized using a mixed solvent of dichloromethane and petroleum ether to give a white solid (4.14 g, 82% yield).

2. Synthesis of Boron Hydroxyl-Containing Organic Compound B-11:

To a dry Schlenk flask was added 11-c (0.32 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr$_3$ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.05 g, 16% yield).

EXAMPLE 12

Synthesis of Boron Hydroxyl-Containing Organic Compound B-12

The synthetic route of a boron hydroxyl-containing organic compound B-12 is as follows:

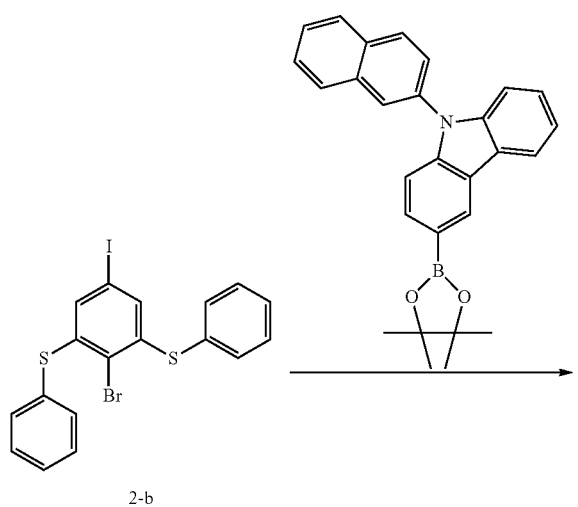

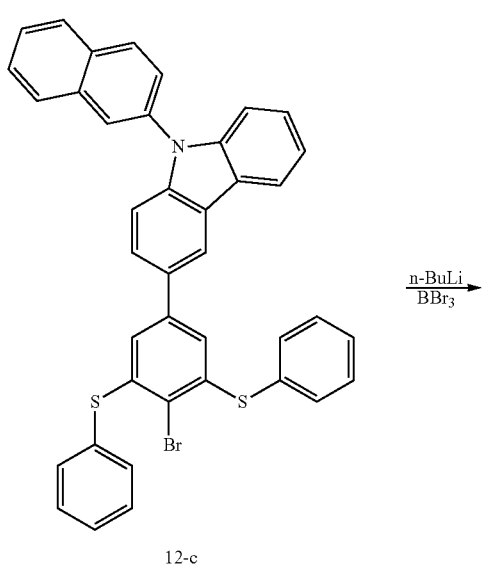

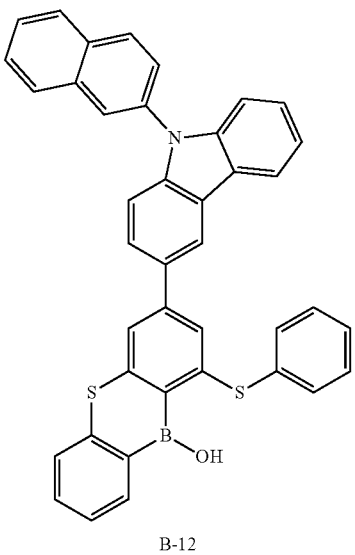

B-12

1. Synthesis of intermediate 12-c:

To a dry two-necked flask were added 2-b (3.98 g, 8 mmol), 9-naphthyl-3-(4,4,5,5-tetramethyl-1,3,2-dioxaborolan-2-yl)-9H-carbazole (3.69 g, 8.8 mmol) and Pd[(PPh)$_3$]$_4$ (0.28 g, 0.24 mmol), followed by three vacuum/nitrogen purge cycles. 32 mL of 1,4-dioxane and 16 mL of an aqueous solution of K$_2$CO$_3$ (2 M) were added. The resultant mixture was stirred at 105° C. for 12 h, cooled to room temperature, extracted with dichloromethane, concentrated to remove dioxane, added to a large amount of dichloromethane and filtered through silica gel. The filtrate was concentrated and then recrystallized using a mixed solvent of dichloromethane and petroleum ether to give a white solid (4.14 g, 78% yield).

2. Synthesis of Boron Hydroxyl-Containing Organic Compound B-12:

To a dry Schlenk flask was added 12-c (0.33 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr$_3$ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.05 g, 15% yield).

EXAMPLE 13

Synthesis of Boron Hydroxyl-Containing Organic Compound B-13

The synthetic route of a boron hydroxyl-containing organic compound B-13 is as follows:

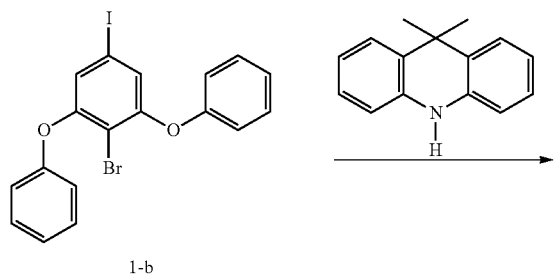

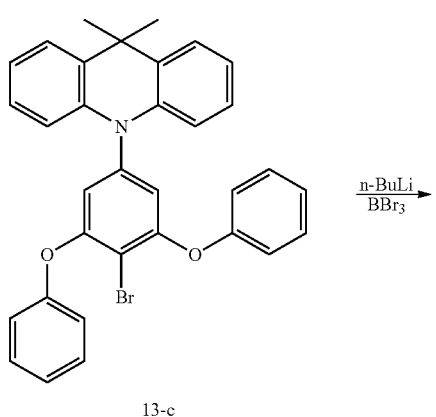

1. Synthesis of Intermediate 13-c:

To a dry two-necked flask were added 1-b (5.11 g, 11 mmol), 9,9-dimethyl-9,10-dihydroacridine (2.10 g, 10 mmol), Pd₂(dba)₃ (280 mg, 0.3 mmol), sodium tert-butoxide (2 g, 20 mmol) and tri-tert-butylphosphine (1.8 mL, 0.9 mmol), followed by addition of 200 mL of toluene. The resultant mixture was stirred at 100° C. for 12 h, concentrated to remove toluene, then added with water and extracted with dichloromethane. The filtrate was concentrated and then purified by column chromatography (dichloromethane:petroleum ether=1:2) to finally give a white solid (4.10 g, 75% yield).

2. Synthesis of Boron Hydroxyl-Containing Organic Compound B-13:

To a dry Schlenk flask was added 13-c (0.27 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr₃ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.03 g, 13% yield).

EXAMPLE 14

Synthesis of Boron Hydroxyl-Containing Organic Compound B-14

The synthetic route of a boron hydroxyl-containing organic compound B-14 is as follows:

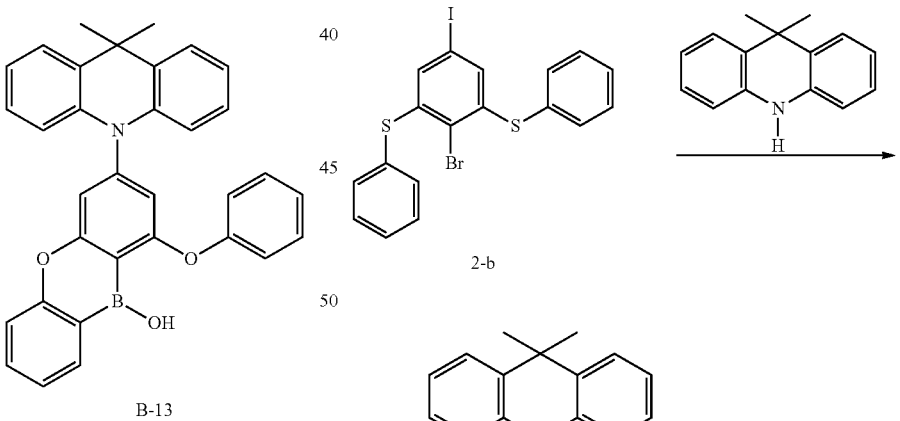

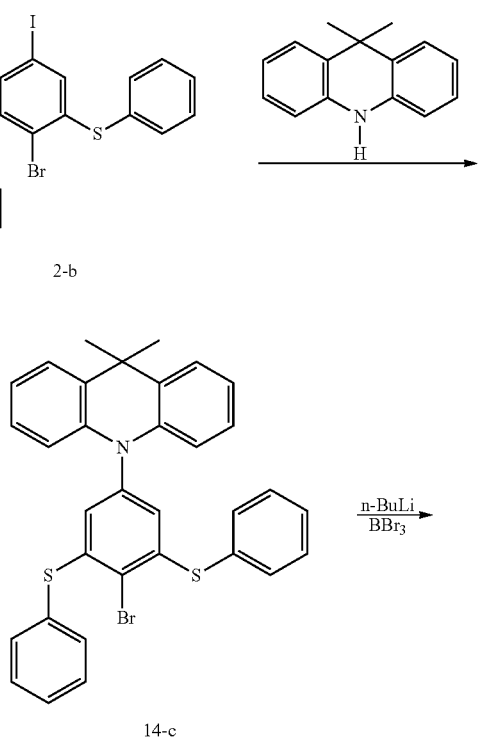

EXAMPLE 15

Synthesis of Boron Hydroxyl-Containing Organic Compound B-15

The synthetic route of a boron hydroxyl-containing organic compound B-15 is as follows:

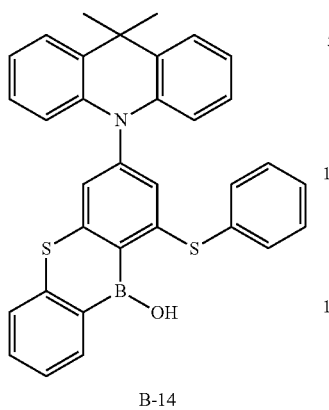

B-14

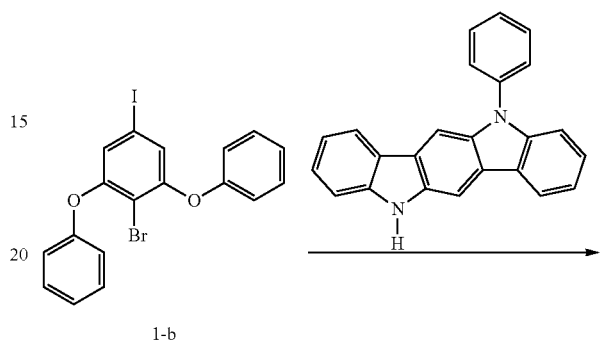

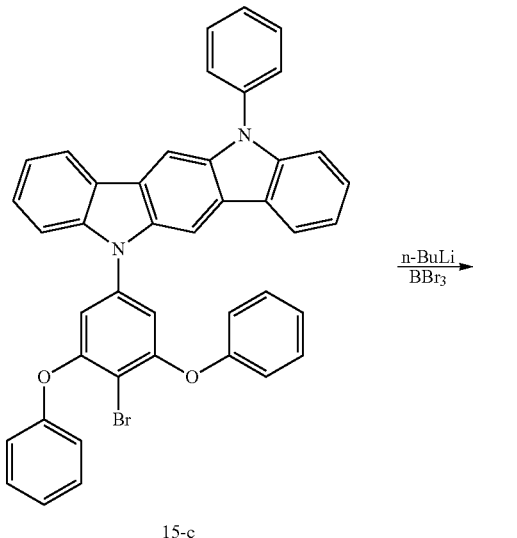

B-15

1. Synthesis of Intermediate 14-c:

To a dry two-necked flask were added 2-b (5.47 g, 11 mmol), 9,9-dimethyl-9,10-dihydroacridine (2.10 g, 10 mmol), Pd$_2$(dba)$_3$ (280 mg, 0.3 mmol), sodium tert-butoxide (2 g, 20 mmol) and tri-tert-butylphosphine (1.8 mL, 0.9 mmol), followed by addition of 200 mL of toluene. The resultant mixture was stirred at 100° C. for 12 h, concentrated to remove toluene, then added with water and extracted with dichloromethane. The filtrate was concentrated and then purified by column chromatography (dichloromethane:petroleum ether=1:2) to finally give a white solid (4.05 g, 70% yield).

2. Synthesis of Boron Hydroxyl-Containing Organic Compound B-14:

To a dry Schlenk flask was added 14-c (0.29 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr$_3$ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.04 g, 15% yield).

1. Synthesis of Intermediate 15-c:

To a dry two-necked flask were added 1-b (5.11 g, 11 mmol), 5-phenyl-5,11-dihydroindolo[3,2-b]carbazole (3.32 g, 10 mmol), Pd$_2$(dba)$_3$ (280 mg, 0.3 mmol), sodium tert-butoxide (2 g, 20 mmol) and tri-tert-butylphosphine (1.8 mL, 0.9 mmol), followed by addition of 200 mL of toluene. The resultant mixture was stirred at 100° C. for 12 h, concentrated to remove toluene, then added with water and extracted with dichloromethane. The filtrate was concentrated and then purified by column chromatography (dichloromethane:petroleum ether=1:2) to finally give a white solid (4.69 g, 70% yield).

2. Synthesis of Boron Hydroxyl-Containing Organic Compound B-15:

To a dry Schlenk flask was added 15-c (0.34 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr$_3$ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.03 g, 10% yield).

EXAMPLE 16

Synthesis of Boron Hydroxyl-Containing Organic Compound B-16

The synthetic route of a boron hydroxyl-containing organic compound B-16 is as follows:

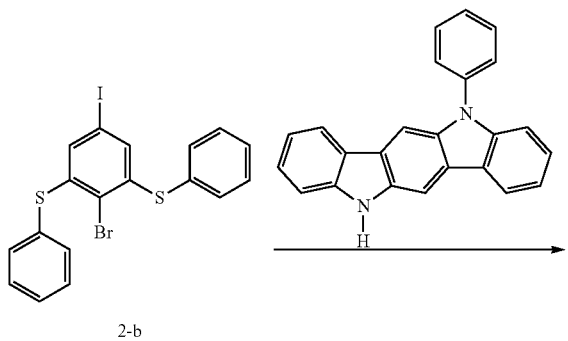

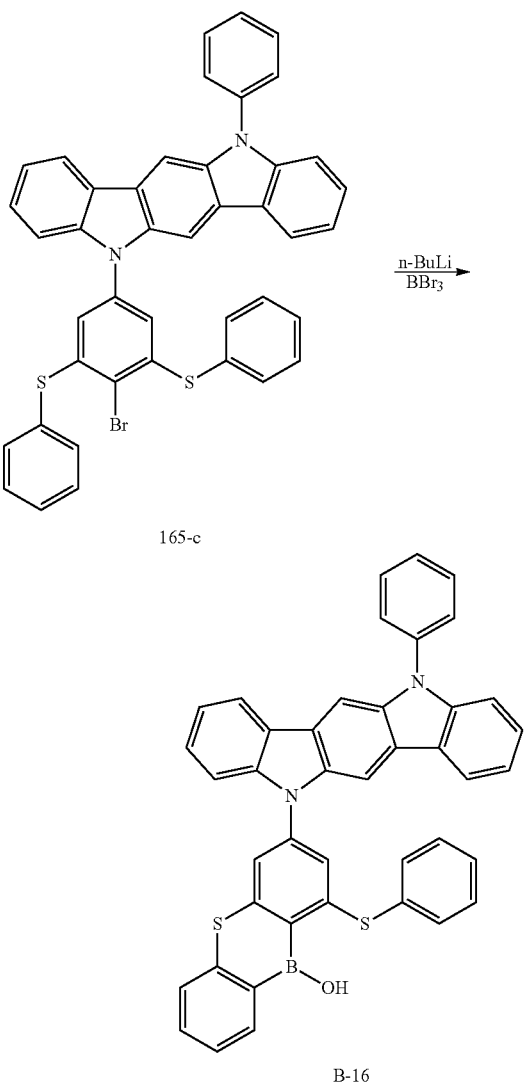

1. Synthesis of Intermediate 16-c:

To a dry two-necked flask were added 2-b (5.47 g, 11 mmol), 5-phenyl-5,11-dihydroindolo[3,2-b]carbazole (3.32 g, 10 mmol), Pd$_2$(dba)$_3$ (280 mg, 0.3 mmol), sodium tert-butoxide (2 g, 20 mmol) and tri-tert-butylphosphine (1.8 mL, 0.9 mmol), followed by addition of 200 mL of toluene. The resultant mixture was stirred at 100° C. for 12 h, concentrated to remove toluene, then added with water and extracted with dichloromethane. The filtrate was concentrated and then purified by column chromatography (dichloromethane:petroleum ether=1:2) to finally give a white solid (4.91 g, 70% yield).

2. Synthesis of Boron Hydroxyl-Containing Organic Compound B-16:

To a dry Schlenk flask was added 16-c (0.25 g, 0.5 mmol). 5 mL of dry m-xylene was added in a nitrogen atmosphere and the reaction system was subjected to three vacuum/nitrogen purge cycles. The resultant mixture was cooled and stirred at −40° C. for 10 min, added dropwise with a solution of n-BuLi (0.65 mmol, 2.5 mol/L) in n-hexane (0.26 mL) in a nitrogen atmosphere, stirred at −40° C. for 1 h, gradually warmed to room temperature and stirred for 1 h. The reaction mixture was cooled to −40° C., added dropwise with BBr₃ (0.65 mmol, 0.061 mL), stirred at −40° C. for 30 min, transferred to an environment with room temperature and stirred for 1 h. The reaction mixture was cooled to 0° C. in an ice bath, added dropwise with N,N-diisopropylethylamine (1.03 mmol, 0.175 mL) after 10 min, stirred at 0° C. for 10 min, then gradually warmed to 100° C. and stirred for 12 h. After the reaction was completed, the reaction mixture was cooled to room temperature, quenched with a potassium acetate solution in deionized water, added with deionized water and extracted with dichloromethane. The organic phase was concentrated under reduced pressure to remove most of m-xylene, recrystallized with petroleum ether and filtered under reduced pressure. The residue was dried to give a yellow solid (0.04 g, 12% yield).

EXPERIMENTAL EXAMPLE

1. X-Ray Monocrystalline Structure Characterization of Boron Hydroxyl-Containing Organic Compounds The monocrystal of boron hydroxyl-containing organic compound B-3 was obtained by slow diffusion of ethanol into a solution of the compound in dichloromethane, and the structure of the monocrystal is shown in FIG. 1. The boron-containing polycyclic unit shows good planarity, with the torsion angle between the two benzene ring planes being 4.3°, which is significantly lower than those (4.9° and 34.9°) of the epoxybridged triphenylamine unit, indicating that the boron-containing polycyclic unit has good rigidity. Furthermore, it is noted that the hydrogen atom of the boron hydroxyl group in the crystalline forms significant hydrogen bonds with the oxygen atom of the adjacent phenyl oxide group, with the bond length being 2.09 Å, which also greatly enhances the stability of the compound.

Figure 2:
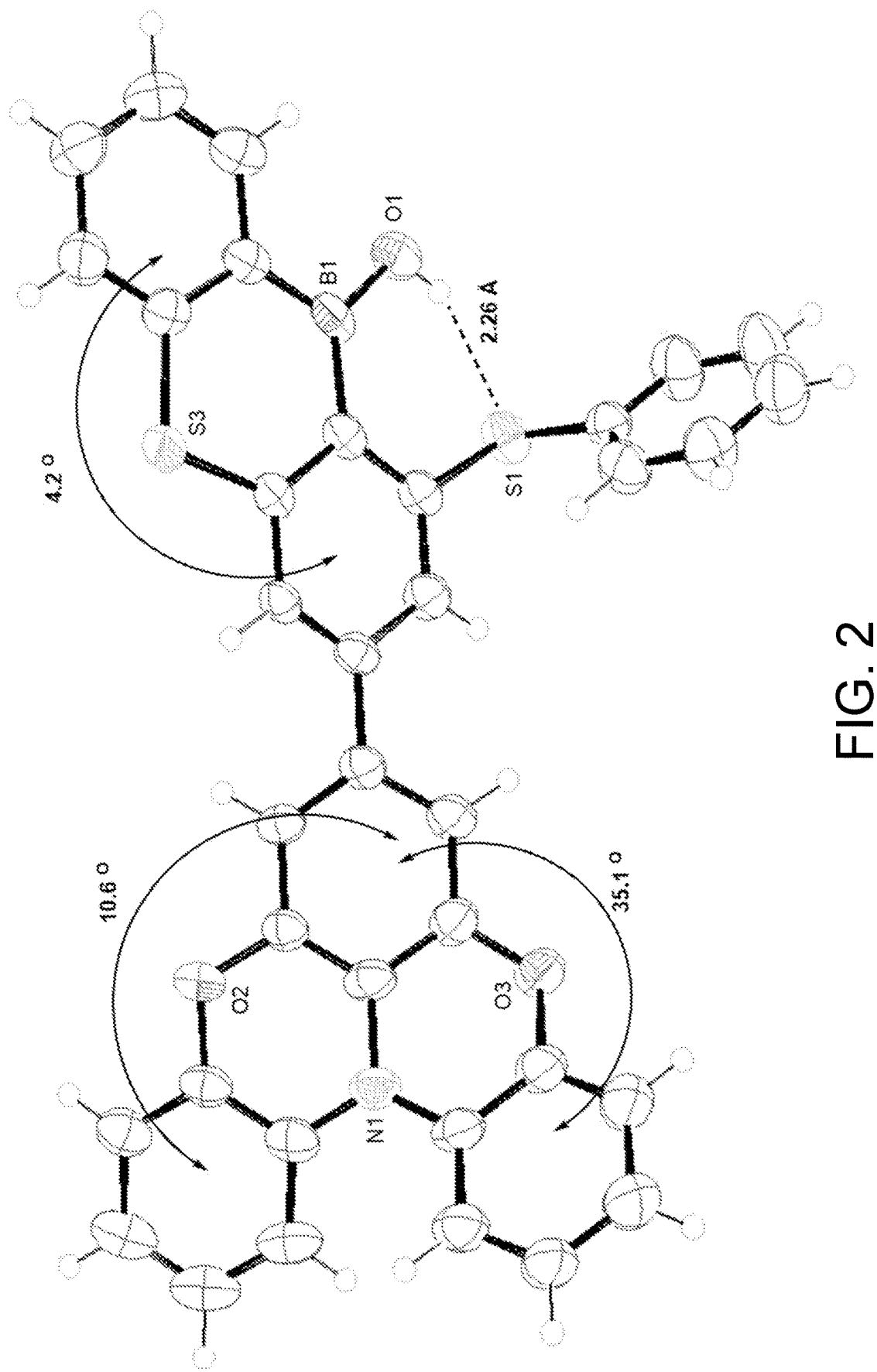
FIG. 2 shows a monocrystalline structure of boron hydroxyl-containing organic compound B-4.

The monocrystal of boron hydroxyl-containing organic compound B-4 was also obtained by slow diffusion of ethanol into a solution of the compound in dichloromethane, and the structure of the monocrystal is shown in FIG. 2. The boron-containing polycyclic unit shows good planarity, with the torsion angle between the two benzene ring planes being 4.3°, which is significantly lower than those (10.6° and 35.1°) of the epoxybridged triphenylamine unit, indicating that the boron-containing polycyclic unit also has certain rigidity. Furthermore, it is noted that the hydrogen atom of the boron hydroxyl group in the crystalline forms significant hydrogen bonds with the sulfur atom of the adjacent phenyl sulfide group, with the bond length being 2.26 Å, which also enhances the stability of the compound to a certain extent.

2. Preparation and Characterization of OLED Devices

An OLED device having the structure ITO/NPD (60 nm)/B-1 to B-16 (5-15 wt %):ADN (85-95 wt %) (15 nm)/TPBi (65 nm)/LiF (1 nm)/Al (150 nm)/cathode were prepared by the following steps:
a. Cleaning of anode conductive glass substrate ITO (indium tin oxide): when used for the first time, ITO could be cleaned with various solvents such as chloroform, ketone and isopropanol, and then treated with ultraviolet, ozone and plasma;
b. NPD (N,N'-di-1-naphthyl-N,N'-diphenylbenzidine) served as the hole transport layer (HTL) (60 nm); B-1 to B-16 and ADN (9-(1-naphthyl)-10-(2-naphthyl)anthracene) collectively served as the emissive layer (EML) (25 nm), wherein B-1 to B-16 served as a guest material and was doped in the host material ADN in a weight ratio of 5-15 wt %; TPBi (1,3,5-tri(1-phenyl-1H-benzimidazole-2-yl)benzene) served as the electron transport layer (ETL) (65 nm): the layers were formed by thermal evaporation in high vacuum (1×10⁻⁶ mbar);
c. Cathode: LiF/Al (1 nm/150 nm) was formed by thermal evaporation in vacuum (1×10⁻⁶ mbar);
d. Encapsulation: The device was encapsulated with a UV-curing resin in a nitrogen glove box.

The current-voltage-luminance (JVL) characteristic of the OLED device was characterized using characterization equipment, with the important parameters such as efficiency and external quantum efficiency recorded. The maximum external quantum efficiency (EQE) of the OLEDs was determined to be 25%, and the EQEs are specifically as follows:

| Complex | B-1 | B-2 | B-3 | B-4 | B-5 | B-6 | B-7 | B-8 | B-9 | B-10 |
|---|---|---|---|---|---|---|---|---|---|---|
| EQE | 15% | 13% | 25% | 20% | 14% | 12% | 15% | 14% | 21% | 19% |

Further optimization, such as optimization of the device structure and combined optimization of HTM, ETM and the host material, will further improves the device performance, especially the efficiency, driving voltage and lifetime. Further optimization, such as optimization of the device structure and combined optimization of HTM, ETM and the host material, will further improves the device performance, especially the efficiency, driving voltage and lifetime.

What is claimed is:

1. A boron hydroxyl-containing organic compound having a structural formula shown in formula I:

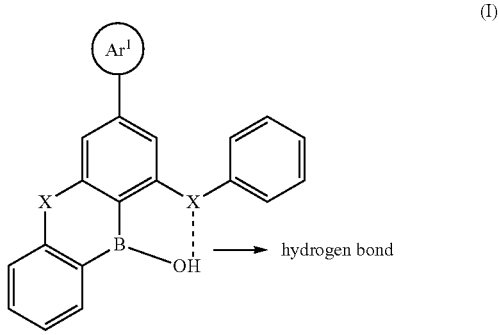

(I)

wherein $Ar^1$ in formula I is an aromatic cyclic hydrocarbon of an aromatic amine, a carbazole or a derivative thereof with a strong electron donating ability, X in formula I is an oxygen or a sulfur atom, and a dotted line ┊ represents a hydrogen bond formed between X and a hydrogen atom in a hydroxyl.

2. The boron hydroxyl-containing organic compound according to claim 1, wherein the compound is one or more selected from the following structures:
(I-1)
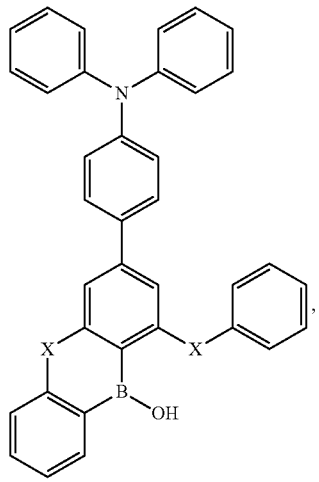
(I-2)
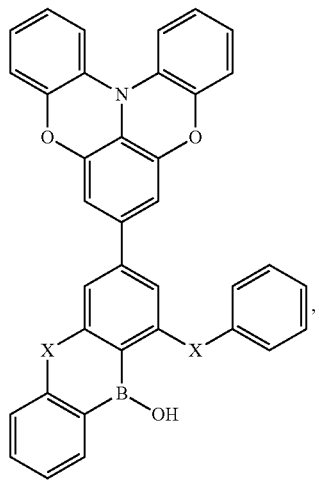
(I-3)
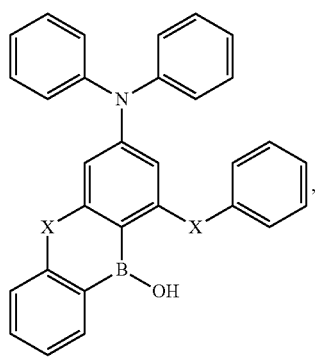
(I-4)
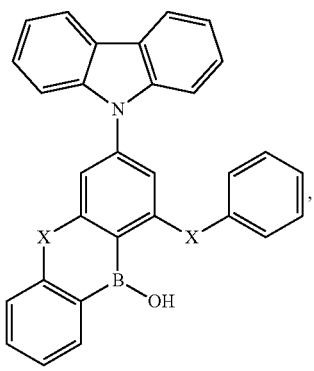
(I-5)
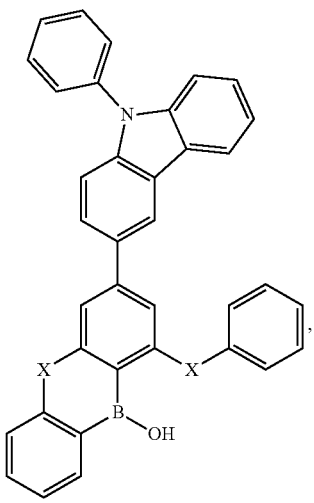
(I-6)
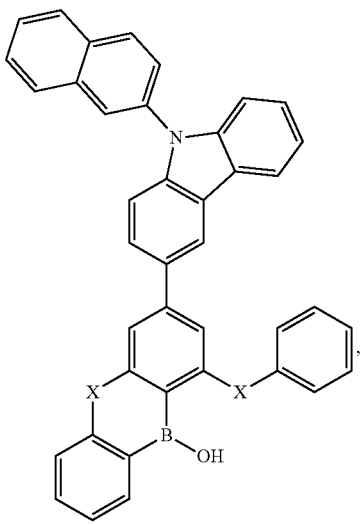

(I-7)

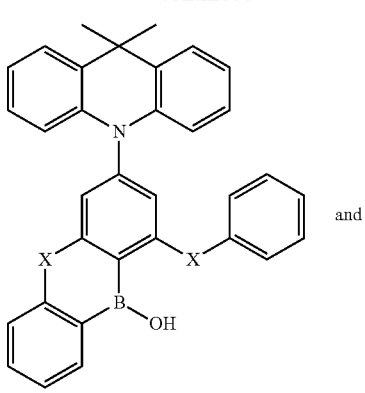

and (I-8)

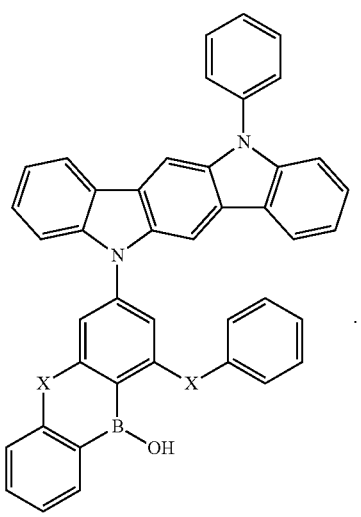

3. A method for preparing the boron hydroxyl-containing organic compound according to claim 1, comprising:
1) first reacting 2-bromo-1,3-difluoro-5-iodobenzene as a starting material with phenol or thiophenol at a high temperature in an alkaline environment to give a corresponding diphenyl oxide derivative or diphenyl sulfide derivative;
2) then conducting a Suzuki coupling reaction of the diphenyl oxide derivative or diphenyl sulfide derivative prepared in step 1) with an aromatic amine, a carbazole or a derivative thereof containing boric acid or a boric ester to synthesize a corresponding coupling intermediate; or conducting a Buchwald-Hartwig coupling reaction of the diphenyl oxide derivative or diphenyl sulfide derivative with a diarylamine, a carbazole and a derivative thereof to synthesize a corresponding coupling intermediate; and
3) finally removing a bromine atom from the coupling intermediate prepared in step 2) using n-BuLi in the absence of water and oxygen at a low temperature, adding boron tribromide and stirring in an alkaline environment of N,N-diisopropylethylamine with controlled reaction temperature and time to finally give the boron hydroxyl-containing organic compound.

4. An organic electronic device comprising the boron hydroxyl-containing organic compound according to claim 1.

5. The organic electronic device according to claim 4, wherein the boron hydroxyl-containing organic compound has a mass concentration of 5-15 wt %.

6. The organic electronic device according to claim 4, wherein the organic electronic device is one or more selected from an organic light-emitting diode, an organic photovoltaic cell, an organic light-emitting cell, an organic field-effect transistor, an organic light-emitting field-effect transistor, an organic laser, an organic spintronic device, an organic sensor or an organic plasmon-emitting diode.

7. An organic electronic device comprising the boron hydroxyl-containing organic compound according to claim 2.

8. A method for preparing the boron hydroxyl-containing organic compound according to claim 2, comprising:
1) first reacting 2-bromo-1,3-difluoro-5-iodobenzene as a starting material with phenol or thiophenol at a high temperature in an alkaline environment to give a corresponding diphenyl oxide derivative or diphenyl sulfide derivative;
2) then conducting a Suzuki coupling reaction of the diphenyl oxide derivative or diphenyl sulfide derivative prepared in step 1) with an aromatic amine, a carbazole or a derivative thereof containing boric acid or a boric ester to synthesize a corresponding coupling intermediate; or conducting a Buchwald-Hartwig coupling reaction of the diphenyl oxide derivative or diphenyl sulfide derivative with a diarylamine, a carbazole and a derivative thereof to synthesize a corresponding coupling intermediate; and
3) finally removing a bromine atom from the coupling intermediate prepared in step 2) using n-BuLi in the absence of water and oxygen at a low temperature, adding boron tribromide and stirring in an alkaline environment of N,N-diisopropylethylamine with controlled reaction temperature and time to finally give the boron hydroxyl-containing organic compound.

* * * * *